United States Patent [19]
Allen et al.

[11] Patent Number: 5,264,325
[45] Date of Patent: Nov. 23, 1993

[54] COMPOSITION FOR PHOTO IMAGING

[75] Inventors: Robert D. Allen, San Jose, Calif.; Richard A. Day, Whitney Point, N.Y.; Donald H. Glatzel, New Milford, Pa.; William D. Hinsberg, Fremont, Calif.; John R. Mertz, Endicott; David J. Russell, Apalachin, both of N.Y.; Gregory M. Wallraff, Morgan Hill, Calif.

[73] Assignee: International Business Machines Corporation, Armonk, N.Y.

[21] Appl. No.: 918,304

[22] Filed: Jul. 21, 1992

Related U.S. Application Data

[63] Continuation-in-part of Ser. No. 793,889, Nov. 18, 1991, Ser. No. 632,032, Dec. 21, 1990, abandoned, and Ser. No. 632,066, Dec. 21, 1990, abandoned, said Ser. No. 632,032, and Ser. No. 632,066, each is a continuation of Ser. No. 318,536, Mar. 3, 1989, Pat. No. 5,026,624, which is a continuation-in-part of Ser. No. 292,173, Dec. 30, 1988, Pat. No. 4,940,651.

[51] Int. Cl.$^5$ ............................................... D04H 1/08
[52] U.S. Cl. ..................................... 430/280; 522/25; 522/31; 522/49; 522/53; 522/101; 522/102
[58] Field of Search ............. 430/280; 522/31, 25, 522/53, 49, 101, 102

[56] References Cited

U.S. PATENT DOCUMENTS

| | | |
|---|---|---|
| 3,794,576 | 2/1974 | Watt . |
| 3,817,906 | 6/1974 | Tsukiok . |
| 4,058,401 | 11/1977 | Crivello . |
| 4,069,054 | 1/1978 | Smith . |
| 4,069,055 | 1/1978 | Crivello . |
| 4,081,276 | 3/1978 | Crivello . |
| 4,138,255 | 2/1979 | Crivello . |
| 4,175,963 | 11/1979 | Crivello . |
| 4,246,147 | 1/1981 | Bakos et al. . |
| 4,250,053 | 2/1981 | Smith . |
| 4,279,985 | 7/1981 | Nonogaki et al. . |
| 4,351,708 | 9/1982 | Berner et al. . |
| 4,442,197 | 4/1984 | Crivello et al. . |
| 4,544,623 | 10/1985 | Audykowski et al. . |
| 4,546,067 | 10/1985 | Irving et al. . |
| 4,548,890 | 10/1985 | Dickinson et al. . |
| 4,548,895 | 10/1985 | Irving et al. . |
| 4,578,425 | 3/1986 | Santorelli ........................... 525/109 |
| 4,624,912 | 11/1986 | Zweifel et al. . |
| 4,659,649 | 4/1987 | Dickinson et al. . |
| 4,684,671 | 8/1987 | Tsuchiya et al. . |
| 4,693,961 | 9/1987 | Bauer . |
| 4,735,891 | 4/1988 | Budde et al. . |
| 4,940,651 | 7/1990 | Brown et al. . |
| 5,026,624 | 6/1992 | Day et al. . |

Primary Examiner—John Kight, III
Assistant Examiner—T. Mosley
Attorney, Agent, or Firm—Calfee, Halter & Griswold

[57] ABSTRACT

An improved photoimagable cationically polymerizable epoxy based coating material is provided, that is suitable for use on a variety of substrates. The material includes an epoxy resin system consisting essentially of between about 10% and about 80% by weight of a polyol resin which preferably is a condensation product of epichlorohydrin and bisphenol A having a molecular weight of between about 40,000 and 130,000; and between about 35% and 72% by weight of an epoxidized glycidyl ether of a brominated bisphenol A having a softening point of between about 60° C. and about 110° C. and a molecular weight of between about 600 and 2,500. A third resin, either an epoxy cresol novolak or a polyepoxy resin, is also added to the resin system. To this resin system is added about 0.1 to about 15 parts by weight per 100 parts of resin of a cationic photoinitiator capable of initiating polymerization of said epoxidized resin system upon exposure to actinic radiation; the system being further characterized by having an absorbance of light in the 330 to 700 nm region of less than 0.1 for a 2.0 mil thick film. Optionally a photosensitizer such as perylene and its derivatives or anthracene and its derivatives may be added.

43 Claims, No Drawings

COMPOSITION FOR PHOTO IMAGING

CROSS REFERENCE TO RELATED APPLICATIONS

This application is a continuation-in-part of copending application Ser. No. 07/793,889, filed Nov. 18, 1991, and copending applications Ser. No. 07/632,032, filed Dec. 21, 1990 is now abandoned, and Ser. No. 07/632,066 is now abandoned, filed Dec. 21, 1990, both of which are continuations of application Ser. No. 07/318,536, filed Mar. 3, 1989, which application issued as U.S. Pat. No. 5,026,624 on Jun. 25, 1991; this latter application is also a continuation-in-part of U.S. Pat. No. 4,940,651 issued Jul. 10, 1990, filed Dec. 30, 1988, as Ser. No. 07/292,173.

FIELD OF THE INVENTION

This invention relates generally to a cationically polymerizable epoxy resin system having photoinitiators added thereto, and which resin system has improved rheological and also photoimaging properties.

BACKGROUND OF THE INVENTION

There are many different instances where photoimagable compositions are utilized in various industrial processes. In one particular process a photoimagable composition is utilized as a solder mask by applying the composition to the underlying printed circuit board. Thereafter photolithographic techniques are employed to reveal various underlying structures on the board while masking others so that solder may be applied by various solder applying processes to the exposed structures. During the solder applying process the solder will adhere to the exposed underlying components and be prevented from adhering where the remaining material operates as a solder mask.

It is necessary that the solder mask material be formulated such that it can be applied by the appropriate methods; for example curtain coating, a preferred method, requires certain rheological properties for effective coating. Further, the solder mask must have the properties of providing efficient transmission of the light or other exposing radiation so as to photolyze the photoinitiator through whatever thickness of material is applied. Also, of course, if the material is to be used as a solder mask, the solder mask must possess appropriate physical and chemical properties to withstand the application of the solder material without significant deterioration, degradation or loss of adhesion to the underlying substrate and maintain its coverage over the portions of the board wherein solder is to be masked. If it is to be used for other purposes, such as an etch resist, other properties may be required.

There have been many prior art proposals for different photoimagable compositions including many that use epoxies. Examples of these are found in the following U.S. Pat. Nos.: 4,279,985; 4,548,890; 4,351,708; 4,138,255; 4,069,055; 4,250,053; 4,058,401; 4,659,649; 4,544,623; 4,684,671; 4,624,912; 4,175,963; 4,081,276; 4,693,961; and 4,442,197. All of these patents show various resins and photoinitiators for use in photoimageable compositions many of which are useful as solder masks. However none of them teach or suggest the specific composition of the present invention.

Good photopatternable formulations which permit high resolution fine line photopatterning have been disclosed in the parent application Ser. No. 07/318,536, which issued as U.S. Pat. No. 5,026,624. It is desirable to have a liquid photoimagable coating which may be used as a solder mask, containing epoxy resin cured with photosensitive cationic initiators which demonstrate good image resolution.

SUMMARY OF THE INVENTION

According to the present invention, an improved photoimagable cationically polymerizable epoxy based coating material demonstrating good image resolution, is provided. The material includes an epoxy resin system comprising between from about 10% to about 90%, preferably about 28% to about 57% by weight of a polyol epoxy resin, and from about 10% to about 90%, preferably about 43% to 72% by weight, of a brominated epoxy resin. Preferably the polyol resin is a condensation product of epichlorohydrin and bisphenol A, and preferably has a molecular weight of between about 40,000 and about 130,000. As used herein, the term "molecular weight" means weight average molecular weight. Where inventors actually measured the molecular weight, it was as measured by size exclusion chromotgraphy. Preferably the brominated resin is an epoxidized glycidyl ether of a brominated bisphenol A resin has a melting point of from about 90° C. and to about 110° C. and a molecular weight of between about 600 and about 2500. A third resin, either an epoxy cresol novolak resin or a polyepoxy resin, or mixtures thereof, are added to the resin system. The epoxy cresol novolak resin is added to increase the photospeed. The epoxy cresol novolak is added from about 3 parts per hundred (pph) to about 80 pph, preferably from about 10 pph to about 25 pph, parts of the combined polyol-brominated epoxy resins. The polyepoxy resin is added to increase the crosslinked density of the polymerized solder mask. The polyepoxy resin may be added from an effective amount to less than 20% (25 pph) of the resin system.

To this resin system is added about 0.1 to about 15 parts by weight per 100 parts of resin of a cationic photoinitiator capable of initiating polymerization of said epoxidized resin systems upon exposure to actinic radiation. Optionally, a photosensitizer in an amount of up to about 10 parts by weight may be added to enable/enhance exposure at other wavelengths. The resin system, exclusive of the photoinitiator and sensitizer, being further characterized by having an absorbance of light in the 330–700 nm region of less than 0.1 for a 2.0 mil film.

DETAILED DESCRIPTION OF THE INVENTION

The present invention provides a photoimagable coating material comprising a cationically polymerizable epoxy resin system, a photoinitiator and optionally a photosensitizer, which are uniformly dispersed therein.

The invention may be used on a variety of substrates, such as: metals, for example, copper, aluminum, and stainless steel; polyimides; and on epoxy-glass laminates not cured with dicyandiamide, such as those cured with imidazoles. While the invention may be used on epoxy-glass laminates cured with dicyandiamide, this substrate is less preferred.

The invention system is specifically adapted for application by curtain coating techniques and for use as a solder mask on a printed circuit substrate. However, the invention system can be used for other applications, such as an etch resist or mask, and also can be coated by other techniques such as roller coating, wound wire rod coating, and screen coating. In one typical solder mask application, the invention is curtain coated by conventional curtain coating techniques onto a substrate to a thickness of about 0.5 to about 4.0 mils or more, dried, photoimaged and developed. The developed areas reveal the desired underlying metallized portions of the substrate wherein solder is to be applied, and the remaining solder mask material is cured and remains on the board as a solder mask during the application of solder by any conventional technique. Thus the system of this invention must have satisfactory rheological properties for application by curtain coating techniques, it must be sensitive to exposure to actinic radiation, which conventionally is in the 330 to 700 nm region, without any significant absorption to thereby allow penetration of the exposure radiation completely through the film; and it must also have the necessary physical and chemical properties to resist degradation during the soldering process. Conventionally, the solder mask remains on the board after soldering and hence for many applications must be fire or flame retardant. Further, the coating should have the photoinitiator uniformly dispersed therein.

In formulating such a coating there are many competing factors that must be considered in order to provide a desired end product. No specific type of epoxy resin has been found which will satisfy all of the various requirements; however, a formulation of a combination or mixture of various epoxy resins according to this invention provides the required properties for a photoimagable flame retardant solder mask composition.

In general, the epoxy resin system contains three resins. One resin is a polyol resin having epoxy functionality such as, for example, a phenoxy polyol resin of a high molecular weight which is a condensation product between epichlorohydrin and bisphenol A. A suitable resin of this type is sold by Union Carbide Corporation under the Trade Mark PKHC. This resin has an epoxide value of about 0.03 equivalents per kg, a weight per epoxide of about 37,000, and a Tg (glass transition temperature) of about 98° C. This resin will provide the basis of the necessary rheological and physical properties necessary to curtain coat for solder mask applications.

However, since flame retardancy is desirable for many applications, and this resin does not exhibit adequate flame retardancy, a second resin is added to provide flame retardancy and impart photoactivity. This second resin is a brominated epoxy resin such as, for example, a low molecular weight, high softening point, glycidyl ether of brominated bisphenol A. A suitable resin of this type is an epoxidized diglycidyl ether of tetrabromo bisphenol A, sold by High Tek Polymers Corporation under the Trade Mark EpiRez 5183. This resin has an epoxide value of about 1.5 equivalents per kg, a weight per epoxide of about 675, and a melting point of about 97° C.

A third resin, either an epoxy cresol novolak resin, or from an effective amount to less than about 25 pph polyepoxy resin is added to the resin system. The epoxy cresol novolak resin is added to increase the photospeed. A suitable resin of this type having an epoxide equivalent weight from about 190 to about 230, and a softening point from about 75° C. to about 95° C., is sold by Dow Chemical Company under the trademark "Quatrex 3710."

The epoxy cresol novolak reasin may be added in an amount from about 3 to about 80, preferably from about 3 to about 25, most preferably about 10 parts per hundred (pph) of the combined polyol resin-brominated epoxy resins weight.

The polyepoxy resin is added to increase the crosslinked density of the polymerized solder mask. Such polyepoxies include, for example, polyfunctional bisphenol A formaldehyde novolak resins having a molecular weight of from about 4,000 to 10,000. Suitable polyepoxy resins of this type include, for example, an octafunctional bisphenol A formaldehyde novolak resin available under the trade name "Epirez SU-8" from High Tek Polymer Corporation. Epirez SU-8 has an epoxide value of 4.7 equivalents per kilogram, a weight per epoxide of 215, and a melting point of 82° C. The polyepoxy resin is added from an effective amount to provide the desired crosslinked density of the polymerized solder mask.

The different epoxy resins described above, selected to be within certain molecular weight ranges, are blended in certain percentages. It has been found generally that from about 10% to about 90%, preferably about 28% to about 57%, more preferably 36% of the polyol resin is desired with the molecular weight being generally in the range of 40,000 to 130,000, and preferably in the range of 60,000 to 90,000. About 10% to about 90% epoxidized brominated bisphenol A is desirable and more preferably about 43% to about 72% and most preferably about 64% with a molecular weight of generally about 600 to 2,500 and preferably about 1,000 to 1,700 can be used.

The specific composition is selected to optimize the desired properties. For example, the PKHC controls the rheology of the coated materials, the 5183 imparts flame retardant properties and photospeed to the material, the cresol novolak imparts a faster photospeed, and the polyepoxy resin increases the crosslinked density of the polymerized solder mask.

In selecting the specific amount of each resin it will of course be understood that by increasing the concentration of any one of the resins, this would also increase the respective property associated with it; however, increasing the concentration of any one of the specific resins would require a decrease in the concentration of the remaining resin or resins, which would result in a decrease of the function of the specific properties associated therewith. A decrease in any of the resins below the broad range percentages indicated above would result in properties which are unacceptable for the specific purpose of curtain coatable flame retardant high resolution photoimageable solder mask material.

As the PKHC amount is decreased, the ensuing rheology results in reduced coverage when the material is applied and the resulting material is more brittle. By reducing the 5183, the resulting system has decreased flame retardant characteristics and, if present below the minimum specified broad range, the flame retardant qualities would not meet certain specified industry requirements, e.g. UL 94 VO Flammability Requirements. However, any amount of the 5183 does provide some flame retardant characteristics.

The epoxy cresol novolak resin increases the photospeed. Reducing the amount of epoxy cresol novolak resin results in a composition with a slower photospeed. Since the polyepoxy increases the cross-linked density of the polymerized solder mask, decreasing the polyepoxy resin results in a product being less thermoset and more thermoplastic. Thus in balancing the formulation of the material, all of these requirements must be considered and the end product optimized to give satisfactory properties for the result desired.

An optional resin which may be added to the resin system is a cycloaliphatic difunctional epoxy resin. A suitable resin of this type is 3,4-epoxycyclohexylmethyl-3,4-epoxy-cyclohexane-carboxylate sold by Union Carbide under the trademark "ERL-4221." This resin has an epoxy equivalent weight of from 131 to about 143, a melting point of 22° C., a specific gravity of 1.18, and an approximate average molecular weight of from about 262 to about 286. Other suitable resins are vinyl cyclohexane, available under the trade name "ERL-4206" from Union Carbide, 2-(3,4-epoxy cyclohexyl-5,5-spiro-3,4-epoxy) cyclohexane-meta-dioxane, available under the trade name "ERL-4324" from Union Carbide, Bis (3,4-epoxy cyclohexyl) adipate, available under the trade name "ERL 4399" cycloaliphatic resins also available from Union Carbide are "ERL-4200," "ERL 4206" and "ERL 4234." ERL-4299 has a melting point of approximately 20° C., a specific gravity of 1.15 and an epoxy equivalent weight of from about 190 to about 210 and an average approximate molecular weight of from about 380 to 420; ERL-4206 has a melting point of approximately 55° C., a specific gravity of 1.09, an epoxy equivalent weight of from about 70 to about 74 and an average approximate molecular weight of from about 140 to 148; ERL-4234 has a melting point of approximately 0° C., a specific gravity of 1.18, an epoxy equivalent weight of from about 133 to about 154 and an average approximate molecular weight of from about 266 to 318. The cycloaliphatic resins, due to their high reactivity, impart a particularly fast photospeed. The cycloaliphatic resins also act as plasticizers.

Another such optional resin is a low molecular weight, liquid, difunctional epoxy resin reaction product of bisphenol A and epichlorohydrin. A suitable resin of this type is sold by Shell Oil Company under the trademark "Epon 826." This resin has an epoxide equivalent weight of from about 178 to about 186 and a density of 1.6 grams per milliliter. Epon 826 will provide a faster photospeed, and since it is a liquid, it may also act as a plasticizer.

Another optional resin which may be added to the three resin system is polypropylene oxide based on a polyether triol. A suitable resin of this type is sold by Union Carbide under the trademark "LHT-240." This resin has an average approximate molecular weight of about 725, a specific gravity of about 1.02, a hydroxyl number of 233 Mg KOH/g, a viscosity of 270 cP(252), and is a liquid at room temperature. The LHT-240 acts as a plasticizer and/or processing aid.

The ERL 4221 and LHR-240 may be added in an amount from up to about 10%, preferably 6%.

A photoinitiator such as various sulfonium salts, iodonium salts, and ferrocene salts is added to the resin system for providing the proper photoresponse to actinic radiation. Since the resin system is cationically photocurable, the photoinitiator must be capable of causing cationic polymerization of the resin upon exposure to radiation. One particularly desirable photoinitiator is a complex triarylsulfonium hexafluoroantimonate salt sold by General Electric Company under the Trademark UVE 1014. Other photoinitiators such triphenylsulfonium hexafluorophosphate sold by General Electric Co. under the Trademark UVE 1016, and diphenyliodonium hexafluoroantimate may be used. Additionally, a photosensitizer such as anthracene or its derivatives, or perylene or its derivatives can also be added which may increase the response speed of photoimaging and/or the wavelength sensitivity. From about 0.1 and about 15 parts by weight of the photoinitiator based on 100 parts of the resin system are normally what is required and optionally up to about 10 parts by weight of a photosensitizer based on 100 parts of the resin system can be used. (It is conventional practice in the art of formulating to designate the percentage of the components of the resin system to add up to 100% and to designate the additions or additives thereto in values of parts by weight based on 100 parts of the resin system, and this convention is adopted herein.)

For some applications, certain additives to the formulation may be desired. For example, a fluorescent or colored dye may be added for inspection or cosmetic purposes. These would be present normally in quantities of about 0.001 to about 1 part per 100 by weight. Examples of these types of dyes that may be used are malachite green oxalate, ethyl violet and rhodamine B. Additionally for some coating applications, it may be desirable to use a surfactant as a coating aid, e.g. Fluorad FC 430 sold by 3M Corp. The Surfactant will normally be present in quantities of 0.01 to 1 part per 100 by weight. A thixotropic agent such as fumed silica may also be added. This is especially useful if the coating is to be screen coated. It will, of course, be understood that the additive must not significantly degrade the other properties of the coating.

Formulations found in Table 1 were analyzed as coatings.

The resulting data are representative of typical values for the formulations listed.

Each example listed in Table I also contained 5 parts per hundred resin parts of UVE 1014 cationic photoinitiator; 0.07 part per hundred resin parts of ethyl violet dye and 0.03 parts per hundred resin parts of the surfactant FC430.

Each example was mixed in a propylene glycol monomethyl ether acetate (PGMEA) solvent, these formulations being about 40% solids in the PGMEA. Each of these particular formulations in this solvent coated very well onto a circuit board using a wire rod. Other moderately polar solvents can be used such as propylene glycol monomethyl ether, 2-methoxyethanol, 2-methoxyethyl acetate, 2-ethoxyethyl acetate, N-methyl pyrrolidone, propylene carbonate, or gamma-butyrolactone.

Samples of formulation 14 were also evaluated for curtain coatability, and successfully curtain coated. Although the other examples were not curtain coated, it is expected that they would also be successfully curtain coated. The coating viscosities range from about 200 to about 2,000 Cps, preferably about 600 Cps and typically dried film thicknesses deposited on the substrate range from about 0.5 to about 4 mils. The solder mask was air dried for 20 minutes then dried for 10 minutes at 125° C. until tack-free.

Other types of coating, such as roller coating, screen coating and spray coating can also be used. If desired, a thixotropic agent such as amorphous silicon dioxide can be added to adjust the rheology of the material to enable it to be flood screen applied or screen applied through a pattern.

During the photoimaging process, the light penetrated essentially completely through the coating to the underlying structure; thus the coating exclusive of the photoinitiator and sensitizer was transparent to this particular light, i.e. had an absorbance of less than 0.1 for the 2 mil thick film.

The material was exposed to 1350 millijoules/cm2 UV radiation from a medium pressure mercury lamp. The UV radiation was passed through a diazo phototool test pattern which is opaque in those areas where the solder mask is to be removed. A Stauffer 21 step wedge was placed underneath a clear portion of the phototool. After exposure to UV radiation, the circuit boards were baked for 15 minutes at 125° C. to accelerate the crosslinking reaction initiated by the sulfonium salt photolysis products. Bake temperatures between 100° C. and 150° C. and times between 2 and 15 minutes were used. The solder mask was then developed using a solvent that easily dissolves any unexposed material. The preferred developer is gamma butyrolactone. Spray developing equipment and other physical agitation of developer solution was used. Curing of the solder mask was accomplished by exposing the solder mask to UV radiation followed by an oven bake at 150° C., for 60 minutes.

If a coating is to be used as a soldermask, surface oxides on the metallic conductors of the circuit substrate should be removed such as with a dilute HCl rinse. After applying an antioxidant such as benzotriazole, circuit boards can be soldered using a variety of methods. Two of the processes used with solder mask described here are wave solder and vapor phase solder. Wave solder involves placing components onto the circuit board, coating the metallic surfaces to be soldered with a flux and passing this assembly through a continuously flowing wave of molten solder. Vapor phase solder is accomplished by applying a solder paste comprised of a flux and solid solder to the exposed metallic surfaces on the board by screening or some other appropriate technique. After placing components on the board the assembly is passed through a vapor which is maintained at a temperature above the melting point of the solder.

However, for the purpose of determining solderability, the samples were tested in a conventional manner using the following "solder shock" test which is a common method for evaluating solder mask performance in the industry. The coated substrate is photoimaged, developed, and fully cured. The part is submersed in molten solder, maintained at 500° F. ±15°, for 10-20 seconds. After the submersion into the solder, the part is allowed to cool to room temperature and inspected. Visual inspection for cracking, flaking, blistering, loss of adhesion or noticeable degradation of the material is performed. If the solder shock does not physically degrade the material, as confirmed by visual inspection, then the solder mask is deemed to have "passed" the solder shock test criteria. All the samples that were tested for solderability as described above "passed."

The samples were also evaluated for the minimum line width and the degree of undercutting present on a line of coating. The exposure dose was monitored using a Stauffer 21 step wedge which was placed under the diazo phototool. The higher the step wedge value, the more sensitive the coating is to the UV light. Accordingly, example 1 having a value of 6 is two times as fast as example 9 having a value of 4, for the same exposure dose. All of the examples demonstrated an acceptable photo sensitivity; the most preferred was example 14.

The "minimum line" represents the minimum coating line width achievable with a particular formulation; it is a measure of resolution. If the undercutting is severe enough, a line will be completely undercut so that it is washed away upon development. A coating which can produce minimum line widths of 2.0 mils. or less is desirable. As can be seen in Table 1, example 9 did not achieve good resolution. The remaining examples achieved good resolution; however, example 9 is less preferred.

Table I contains values for the amount of undercutting along a line of coating. The edges of an undercut line of coating display a hazy, whitish color when optical microscopy is employed for evaluation. This haze extends inward from the edge of the line for a distance that corresponds to the amount of undercutting below the line surface. This haze may be measured at several points over the length of a line and averaged. It is desirable to have 0.5 mil. or less of undercutting along a line of coating. Since example 9 displays a high degree of undercutting, this formulation is less preferred.

The examples were also tested for flexibility. A sample was coated to a thickness of about 1.5 mils. onto aluminum foil. The foil was then flexed by hand and visually examined under a microscope using low power. Samples that exhibited any cracking, delamination or flaking did not pass the test. Example 9 did not pass.

Examples 5, 12 and 14 have good overall characteristics for curtain coating and use as a solder mask. Example 5 is the most preferred.

Thus, when used, the composition is coated onto the desired substrate, then dried to remove the solvent. While drying processes are known to one skilled in the art, it has been found that about 20 minutes at about 20° to 30° C. followed by about 10 to about 20 minutes at about 125° C. works well. The composition is then photoimaged by exposing it to actinic radiation through a phototool, and then developed. Next the composition is cured by exposing it to UV light from about 1 to 6 Joules per square centimeter, and baking in an oven for about 30 minutes to about 90 minutes at from about 130° to about 160° C.

This invention has been described specifically as a formulation for curtain coating solder mask material, suitable for use on a variety of substrates. However, it can be used for other purposes such as, a protective coating or an etch resist and may be applied by various other techniques. Also, other types of coating, such as roller coating can be used to apply the material. Where different uses and coating techniques are employed, certain modifications of the preferred material and process may be necessary to meet different requirements. For example, a different solvent may be desired for roller coating or screen coating as opposed to curtain coating and the rheological properties may be varied from the optimum for curtain coating for the different types of uses.

While the resin system has been described in specific terms, in its broadest aspects the resin system comprises: from about 10% to about 90% by weight of a polyol resin of high molecular weight, between about 10% to about 90% by weight of a brominated epoxy resin of a low molecular weight, and between about 3 pph to about 80 pph of an epoxy cresol novolak resin, or from an effective amount to less than 25 pph (20%) of a polyepoxy resin.

While the invention has been described with a certain degree of particularity, various adaptations and modifications can be made without departing from the scope of the invention as defined in the appended claims.

TABLE 1

| Eg. | PKHC % | EpiRez 5183 % | Quatrex pph | Epirez SU8 pph | ERL 4221 pph | LHT 240 pph | Step Wedge* Dry[1] | MinLine[2] (mils) Dry[1] | Undercut (mils) Dry[1] | Solder-shock | Flex |
|---|---|---|---|---|---|---|---|---|---|---|---|
| 1 | 36 | 64 | 3 | — | — | — | 6.0 | 1.5 | <0.5 | — | — |
| 2 | 36 | 64 | 5 | — | — | — | 5.0 | 1.5 | 0.49 | — | — |
| 3 | 36 | 64 | 6 | — | — | — | 6.0 | 1.5 | <0.5 | — | — |
| 4 | 36 | 64 | 8 | — | — | — | 6.0 | 1.5 | 0.45 | — | — |
| 5 | 36 | 64 | 10 | — | — | — | 4.8 | 1.5 | 0.55 | — | — |
| 6 | 36 | 64 | 15 | — | — | — | 5.4 | 2.0 | 0.51 | — | — |
| 7 | 36 | 64 | 18 | — | — | — | 6.0 | 1.0 | <0.5 | — | — |
| 8 | 36 | 64 | — | 5 | — | — | 5.0 | 2.0 | 0.63 | — | — |
| 9 | 36 | 64 | — | 16 | — | — | 4.0 | 2.5 | 1.2 | — | f |
| 10 | 39 | 61 | — | 35 | 6 | — | 6.3 | 1.5 | 0.4 | p | p |
| 11 | 39 | 61 | — | 35 | 8 | 8 | 5.0 | 1.5 | 0.5 | p | p |
| 12 | 36 | 64 | 20 | — | — | — | 6.0 | 1.0 | <0.5 | — | — |
| 13 | 36 | 64 | 22 | — | — | — | 6.0 | 1.0 | <0.5 | — | — |
| 14 | 36 | 64 | 25 | — | — | — | 6.3 | 1.0 | <0.5 | p | p |

*Stauffer 21 wedge step increment values.
[1]Epoxy-glass laminate made from dry prepeg.
[2]Minimum line width present after imaging through a resolution target.
p - pass
f - fail
— denotes no data available
pph - parts per hundred parts of PKHC-Epirez 5183
% - percent by weight

What is claimed is:

1. A photosensitive cationically polymerizable epoxy based imaging system comprising:
   a. an epoxy based resin system having solids comprising:
      i. between about 10% and about 90% by weight of a polyol resin of a high molecular weight;
      ii. between about 10% and about 90% by weight of a brominated epoxy resin of a low molecular weight;
      iii. between about 3 pph and 80 pph, of an epoxy cresol novolak resin which increases the photospeed of the imaging system, or from an effective amount to less than about 25 pph polyepoxy resin to increase the crosslinked density of the polymerized solder mask or mixtures thereof;
   b. from about 0.1 to about 15 parts by weight of a cationic photoinitiator capable of initiating polymerization in said epoxidized resin system upon exposure to actinic radiation;
   said resin system being further characterized by having an absorbance of light in the 330 to 700 nm region of less than 0.1 for a 2 mil thick film.

2. The invention as defined in claim 1, wherein there is between about 28% and about 57% of the polyol resin; between about 43% and about 72% of the brominated epoxy resin; between about 3 ppH and 25 pph, of an epoxy cresol novolak resin, or from an effective amount to less than about 25 pph polyepoxy resin to increase the crosslinked density of the polymerized solder mask; and between about 2 and 5 parts by weight of the cationic photoinitiator.

3. The invention as defined in claim 1, wherein the molecular weight of the polyol resin is between about 60,000 and about 90,000; and the molecular weight of the brominated epoxy resin is between about 1,000 and about 1,700.

4. The invention as defined in claim 1, wherein an effective amount of up to 10% of photosensitizer is included.

5. The invention as defined in claim 1, wherein the photoinitiator is a sulfonium salt.

6. The invention as defined in claim 4, wherein the photosensitizer is selected from the group consisting of anthracene and its derivatives and perylene and its derivatives.

7. The invention as defined in claim 1, further characterized by an effective amount up to about 1 part by weight of a surfactant.

8. The invention as defined in claim 1, further characterized by an effective amount up to about 1 part by weight of dye.

9. The invention as defined in claim 1, wherein there is about 36% polyol resin; about 64% of the brominated epoxy resin; about 10 pph of an epoxy cresol novolak resin, or from an effective amount to less than about 25 pph polyepoxy resin to increase the crosslinked density of the polymerized solder mask; and about 5 parts by weight of sulfonium salt initiator.

10. The invention as defined in claim 1, wherein there is about 57% polyol resin; about 43% of the brominated epoxy resin; about 5 parts by weight of the sulfonium salt initiator.

11. The invention as defined in claim 1, wherein there is about 28% polyol resin; about 72% of the brominated epoxy resin; about 10 pph of an epoxy cresol novolak resin, or from an effective amount to less than about 25 pph polyepoxy resin; and about 5 parts by weight of the sulfonium salt initiator.

12. The invention as defined in claim 1, wherein the brominated epoxy resin is an epoxidized glycidyl of a tetrabromo bisphenol A resin.

13. The invention as defined in claim 1, wherein the brominated epoxy resin is an epoxidized glycidyl ether of a brominated bisphenol A resin.

14. The invention as defined in claim 1, further characterized by said resin system being dispersed in a moderately polar solvent.

15. The invention as defined in claim 14, wherein said solvent is propylene glycol monomethyl ether acetate.

16. The invention as defined in claim 14, wherein there is a concentration of about 40% solids in the solvent.

17. The invention as defined in claim 1, further characterized by from an effective amount up to about 40% by weight of a low molecular weight, liquid, difunctional epoxy resin.

18. The invention as defined in claim 1, wherein the resin system is comprised of about 28% polyol resin; about 43% of the brominated epoxy resin; and about 29 pph of a low molecular weight, difunctional epoxy resin; wherein the imaging system is comprised of about 5 parts by weight of the sulfonium salt initiator.

19. The invention as defined in claim 1, wherein the resin system is comprised of about 34% polyol resin; about 52% of the brominated epoxy resin; and about 14 pph of a low molecular weight difunctional epoxy resin; wherein the imaging system is comprised of about 5 parts by weight of the sulfonium salt initiator.

20. The invention as defined in claim 1, further characterized by an effective amount of a thixotrope.

21. The invention as defined in claim 1, further characterized by an effective amount of a low molecular weight polyol to act as a plasticizer.

22. An improved photosensitive cationically polymerizable epoxy base imaging system comprising:
  a. an epoxy resin system comprising:
    between about 28% and about 57% by weight of a polyol resin which is a condensation product of epichlorohydrin and bisphenol A having a molecular weight of between about 40,000 and about 130,000;
    between about 43% and about 72% by weight of an epoxidized glycidyl ether of tetrabromo bisphenol A having a softening point of between about 60° and about 110° C. and a molecular weight of between about 600 and about 2,500;
    between about 3 pph and 25 pph, of an epoxy cresol novolak resin; or from an effective amount to less than about 25 pph polyepoxy resin to increase the crosslinked density of the polymerized solder mask;
    from about 0.1 to about 15 parts by weight of a cationic photoinitiator capable of initiating polymerization in said epoxidized resin system upon exposure to actinic radiation; and
    said resin system being further characterized by having an absorbance of light in the 330 to 700 nm region of less than 0.1 for a 2 mil thick film.

23. A printed circuit board comprising:
  a. a printed circuit substrate;
  b. a photosensitive cationically polymerizable epoxy based imaging system disposed on said substrate and imaged, developed and cured to form a solder mask;
  said imaging system comprising:
    i. an epoxy resin system having solids comprising:
      (1) between about 10% and 90% by weight of a polyol resin;
      (2) between about 10% and about 90% by weight of a brominated epoxy resin;
      (3) between about 3 pph and 80 pph, of an epoxy cresol novolak resin; or from an effective amount to less than about 25 pph polyepoxy resin to increase the crosslinked density of the polymerized solder mask;
    ii. from about 0.1 to about 15 parts by weight of a cationic photoinitiator capable of initiating polymerization in said epoxidized resin system upon exposure to actinic radiation; said resin system being further characterized by having an absorbance of light in the 330 to 700 nm region of less than 0.1 for a 2 mil thick film.

24. The invention as defined in claim 22, wherein the molecular weight of the polyol resin is between about 40,000 and 130,000 and the molecular weight of the brominated epoxy resin is between about 600 and about 2500.

25. The invention as defined in claim 22, wherein the photoinitiator is a sulfonium salt.

26. The invention as defined in claim 22, further characterized by an effective amount of a low molecular weight polyol to act as a plasticizer.

27. A method of producing a coated circuit board comprising the steps of:
  a. providing a photoimaging composition comprising:
    i. a photosensitive cationically polymerizable epoxy based imaging system comprising:
      (a) between about 10% and about 90% by weight of a polyol resin of a high molecular weight;
      (b) between about 10% and about 90% by weight of a brominated epoxy resin of a low molecular weight;
      (c) between about 3 pph and 80 pph, of an epoxy cresol novolak resin; or from an effective amount to less than about 25 pph polyepoxy resin to increase the crosslinked density of the polymerized solder mask;
    ii. from about 0.1 to about 15 parts by weight of a cationic photoinitiator capable of initiating polymerization in said epoxidized resin system upon exposure to actinic radiation;
    said resin system being further characterized by having an absorbance of light in the 330 to 700 nm region of less than 0.1 for a 2 mil thick film;
  b. providing a printed circuit substrate;
  c. coating the composition onto the printed circuit substrate;
  d. drying the composition;
  e. exposing the composition to actinic radiation;
  f. developing the composition; and,
  g. curing the composition.

28. The invention as defined in claim 27, wherein there is between about 28% and about 57% of the polyol resin; between about 43% and about 72% of the brominated epoxy resin; between about 3 pph to about 25 pph, of an epoxy cresol novolak resin; or from an effective amount to less than about 25 pph polyepoxy resin to increase the crosslinked density of the polymerized solder mask; and between about 2 and 5 parts by weight of the cationic photoinitiator.

29. The invention as defined in claim 27, wherein the molecular weight of the polyol resin is between about 60,000 and about 90,000; the molecular weight of the brominated epoxy resin is between about 1,000 and about 1,700.

30. The invention as defined in claim 27, wherein an effective amount of up to 10% of photosensitizer is included.

31. The invention as defined in claim 27, wherein the photoinitiator is a sulfonium salt.

32. The invention as defined in claim 27, wherein the photosensitizer is selected from the group consisting of anthracene and its derivatives and perylene and its derivatives.

33. The invention as defined in claim 27, wherein there is about 36% polyol resin; about 64% of the brominated epoxy resin; about 10 pph, of an epoxy cresol novolak resin; or from an effective amount to less than about 25 pph polyepoxy resin to increase the cross-linked density of the polymerized solder mask; about 5 parts by weight of sulfonium salt initiator.

34. The invention as defined in claim 27, wherein there is about 57% polyol resin; about 43% of the brominated epoxy resin; about 5 parts by weight of the sulfonium salt initiator.

35. The invention as defined in claim 27, wherein there is about 28% polyol resin; about 72% of the brominated epoxy resin; about 5 parts by weight of the sulfonium salt initiator.

36. The invention as defined in claim 27, wherein the brominated epoxy resin is an epoxidized glycidyl ether of a tetrabromo bisphenol A resin.

37. The invention as defined in claim 27, wherein the brominated epoxy resin is an epoxidized glycidyl ether of a brominated bisphenol A resin.

38. The invention as defined in claim 27, further characterized by said resin system being dispersed in a moderately polar solvent.

39. The invention as defined in claim 38, wherein said solvent is propylene glycol monomethyl ether acetate.

40. The invention as defined in claim 38, wherein there is a concentration of about 40% solids in the solvent.

41. The invention as defined in claim 27, further characterized by an effective amount up to about 40% by weight of a low molecular weight difunctional epoxy resin.

42. The invention as defined in claim 27, further characterized by an effective amount of a thixotrope.

43. The invention as defined in claim 27, further characterized by an effective amount of a low molecular weight polyol to act as a plasticizer.

* * * * *